(12) United States Patent
Lin

(10) Patent No.: US 9,711,442 B1
(45) Date of Patent: Jul. 18, 2017

(54) SEMICONDUCTOR STRUCTURE

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 15/245,200

(22) Filed: Aug. 24, 2016

(51) Int. Cl.
*H01L 23/12* (2006.01)
*H01L 23/48* (2006.01)
*H01L 23/498* (2006.01)
*H01L 23/00* (2006.01)

(52) U.S. Cl.
CPC .. *H01L 23/49827* (2013.01); *H01L 23/49816* (2013.01); *H01L 23/49838* (2013.01); *H01L 24/17* (2013.01)

(58) Field of Classification Search
CPC ......... H01L 23/49827; H01L 23/49822; H01L 23/49811; H01L 23/49838; H01L 21/486; H01L 23/481; H01L 23/49816; H01L 24/17; H01L 24/16
See application file for complete search history.

(56) References Cited

U.S. PATENT DOCUMENTS 5,744,758 A * 4/1998 Takenouchi ...... H01L 23/49827
174/255

FOREIGN PATENT DOCUMENTS

| TW | 200631155 A | 9/2006 |
| TW | 201113999 A | 4/2011 |
| TW | 201240045 A1 | 10/2012 |
| TW | 201426908 A | 7/2014 |
| TW | 201616632 A | 5/2016 |

* cited by examiner

*Primary Examiner* — Jasmine Clark
(74) *Attorney, Agent, or Firm* — CKC & Partners Co., Ltd.

(57) ABSTRACT

A semiconductor structure is provided. The semiconductor structure includes an electronic component and a board structure. The board structure includes a dielectric layer structure and at least one elastomer. The dielectric layer structure has a mount region and a peripheral region surrounding the mount region. The electronic component is disposed on the mount region, and the peripheral region has at least one first through hole. The elastomer is disposed in the first through hole.

20 Claims, 5 Drawing Sheets

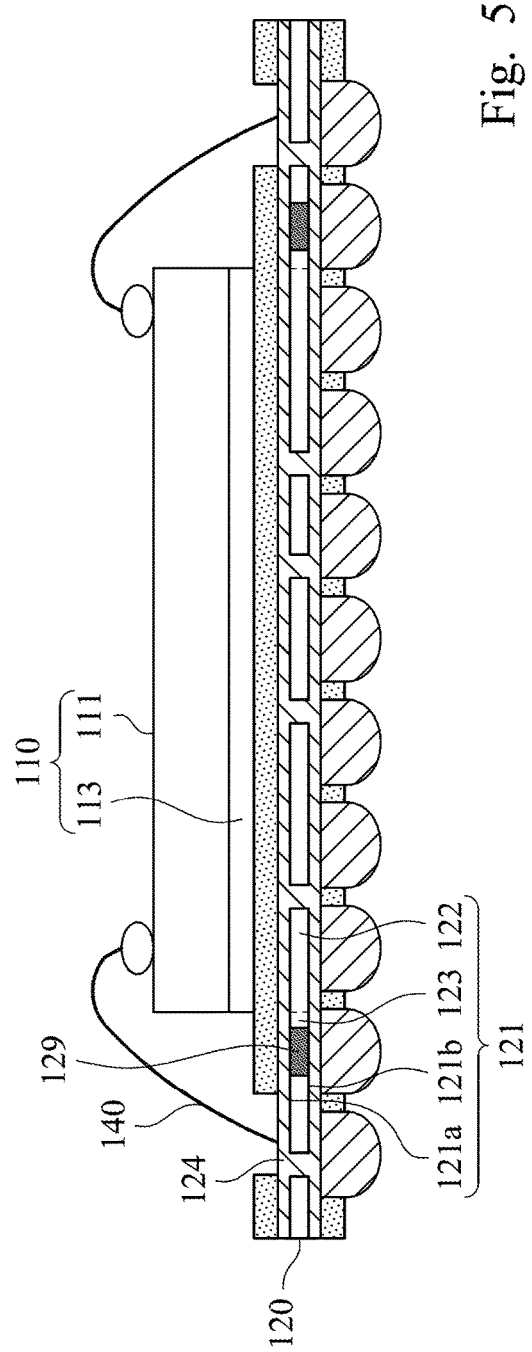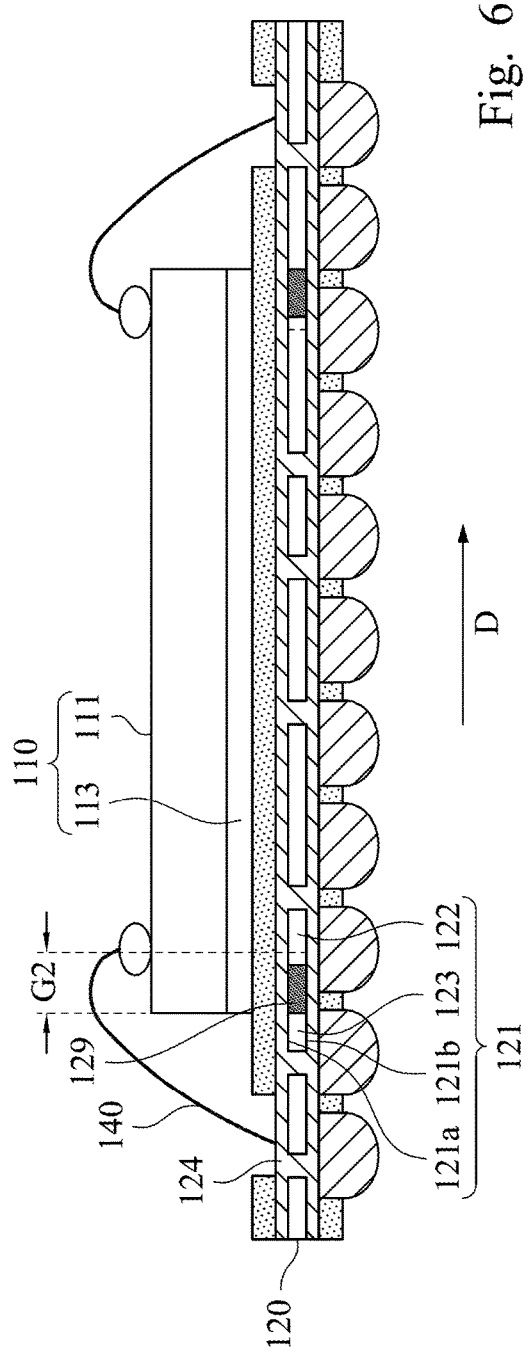

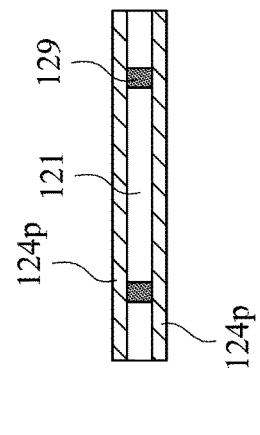
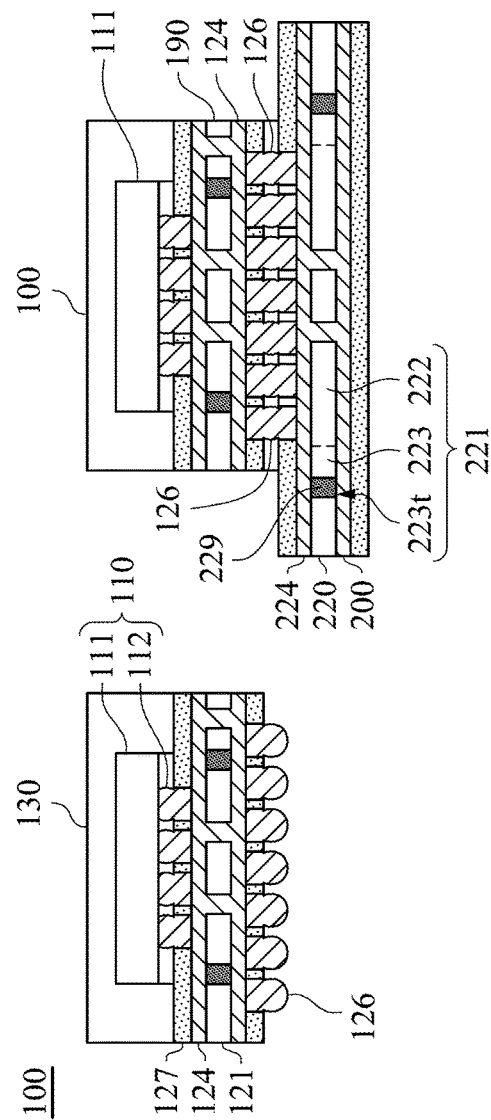
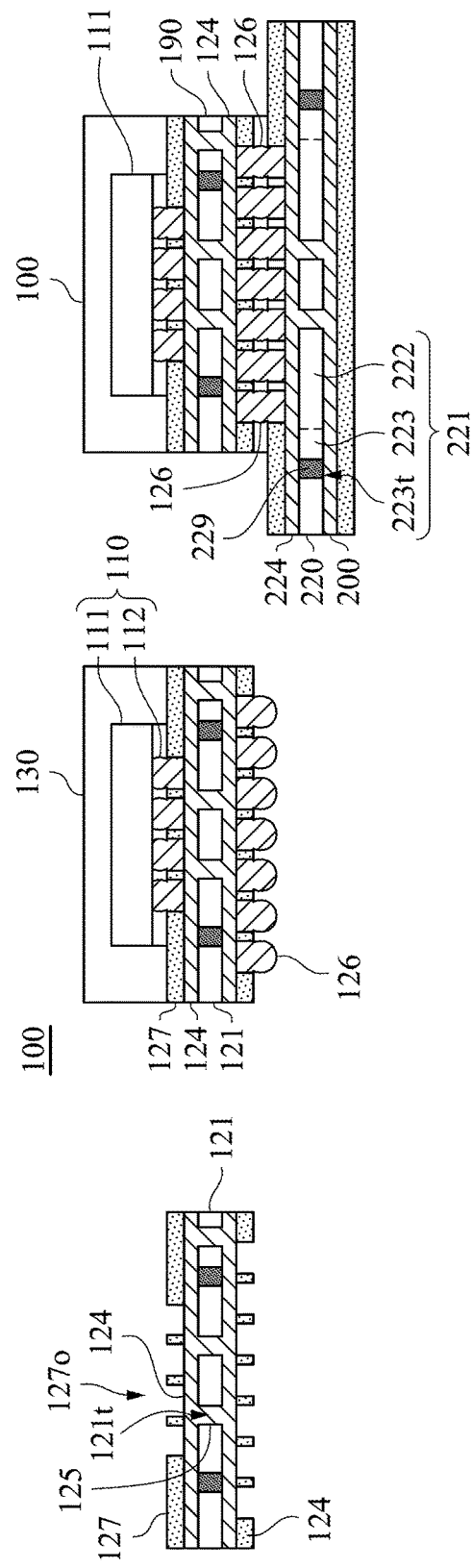

SEMICONDUCTOR STRUCTURE

BACKGROUND

Technical Field

The present disclosure relates to a semiconductor structure.

Description of Related Art

With the rapid growth of electronic industry, the R & D of electronic products is gradually directed to the pursuit of versatile and high performance. In order to achieve the requirements of high integration and miniaturization of semiconductor components, the requirements of semiconductor package structures also increase, which may lead to unprecedented problems. For example, when the line width and pitch of the semiconductor package structures become smaller and smaller, joints fail more often.

To further improve various characteristics of a semiconductor package structure, persons in the industry all endeavor to search the solutions. How to provide a semiconductor package structure with better characteristics is one of the important research topics, and is also a target that needs to be improved in the related fields.

SUMMARY

This disclosure provides a semiconductor structure to solve the joint issue.

In one aspect of the disclosure, a semiconductor structure is provided. The semiconductor structure includes an electronic component and a board structure. The board structure includes a dielectric layer structure and at least one elastomer. The dielectric layer structure has a mount region and a peripheral region surrounding the mount region. The electronic component is disposed on the mount region, and the peripheral region has at least one first through hole. The elastomer is disposed in the first through hole.

In one or more embodiments, the dielectric layer structure has a first surface and a second surface opposite to the first surface, and the first surface and the second surface exposes the elastomer.

In one or more embodiments, the elastomer protrudes from at least one of the first surface and the second surface.

In one or more embodiments, the dielectric layer structure has a first surface and a second surface opposite to the first surface, and the thickness of the elastomer is greater than the minimum distance between the first surface and the second surface.

In one or more embodiments, the elastomer is made of polyimide.

In one or more embodiments, the elastomer passes through the dielectric layer structure.

In one or more embodiments, the elastomer is adjacent to the mount region.

In one or more embodiments, an orthogonal projection of the electronic component on the board structure at least partially overlaps the elastomer.

In one or more embodiments, the board structure is disposed along a first direction, the distance between a center of the elastomer and an outer edge of the orthogonal projection of the electronic component on the board structure along the first direction is less than 5 mm.

In one or more embodiments, the board structure further includes a patterned conductive layer disposed on the dielectric layer structure.

In one or more embodiments, the dielectric layer structure further have at least one second through hole. The board structure further includes at least one conductive via disposed in the second through hole and electronically connected to the patterned conductive layer.

In one or more embodiments, the dielectric layer structure is a core layer or an interposer.

In one or more embodiments, the dielectric layer structure includes a core layer and at least one build-up dielectric layer.

In one or more embodiments, the board structure is a chip carrier and the electronic component includes a chip.

In one or more embodiments, the electronic component further includes a plurality of bumps connected to the chip and the board structure. Outer edges of the mount region are defined by deposition positions of the outermost bumps.

In one or more embodiments, the electronic component further includes an die attachment disposed between the chip and the board structure, in which outer edges of the mount region are defined by outer edges of an orthogonal projection of the chip on the board structure.

In one or more embodiments, the electronic component further includes an die attachment disposed between the chip and the board structure, and the board structure is disposed along a first direction, in which the mount region is smaller than an orthogonal projection of the chip on the board structure, and the distance between outer edges of the mount region and outer edges of the orthogonal projection of the chip on the board structure along the first direction is less than 5 mm.

In one or more embodiments, the board structure is a printed circuit board and the electronic component includes a chip carrier and a chip disposed on the chip carrier.

In one or more embodiments, the electronic component further includes a plurality of bumps connected to the chip carrier and the board structure. Outer edges of the mount region are defined by deposition positions of the outermost bumps.

In one or more embodiments, the board structure is a copper clad laminate.

Because the chip and the board structure have different coefficients of thermal expansion (CTE), the CTE mismatch between the chip and the board structure causes the warpage of the board structure. When the board structure is disposed on a printed circuit board, the warpage of board structure generates stress on the bumps, such that the bumps often are damaged and joints may fail.

For the mount region, because the chip is disposed on the mount region, the warpage of the mount region may not be serious. However, the warpage of the peripheral region is often serious since there is no other supporter. By disposing the elastomer in the peripheral region, the stress transferred from the mount region to the peripheral region is absorbed by the elastomer, such that the warpage of the peripheral region is lessened or disappears. Therefore, the bumps may not receive too much stress, and the joint issue can be avoided.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 5 is a schematic cross-sectional view of the semiconductor structure according to another embodiment of this disclosure;

FIG. 6 is a schematic cross-sectional view of the semiconductor structure 100 according to another embodiment of this disclosure;

FIGS. 8 to 12 are schematic cross-sectional views of intermediate steps in a method for manufacturing the semiconductor structure according to one embodiment of this disclosure; and FIG. 13 is a schematic cross-sectional view of the semiconductor structure and a printed circuit board according to one embodiment of this disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
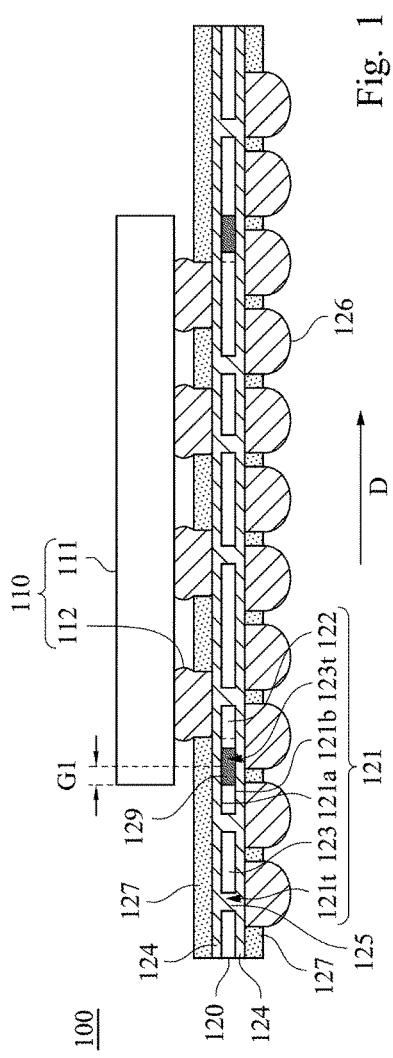
FIG. 1 is a schematic cross-sectional view of a semiconductor structure according to one embodiment of this disclosure.

FIG. 1 is a schematic cross-sectional view of a semiconductor structure 100 according to one embodiment of this disclosure. A semiconductor structure 100 is provided. In this embodiment, the semiconductor structure 100 is a package structure.

As shown in FIG. 1, the semiconductor structure 100 includes an electronic component 110 and a board structure 120. The board structure includes 120 a dielectric layer structure 121 and at least one elastomer 129. The dielectric layer structure 121 has a mount region 122 and a peripheral region 123 surrounding the mount region 122. The electronic component 110 is disposed on the mount region 122, and the peripheral region 123 has at least one first through hole 123t. The elastomer 129 is disposed in the first through hole 123t.

In this embodiment, the electronic component 110 includes a chip 111 and a plurality of bumps 112. The bumps 112 are connected to the chip 111 and the board structure 120. The board structure 120 is a chip carrier.

The dielectric layer structure 121 further has at least one second through hole 121t. The board structure 120 further includes two patterned conductive layers 124 and at least one conductive via 125. The two patterned conductive layers 124 are respectively disposed on two sides of the dielectric layer structure 121. The conductive via 125 is disposed in the second through hole 121t and electronically connected to the patterned conductive layers 124.

The board structure 120 further includes a plurality of bumps 126. The bumps 126 are disposed on the patterned conductive layer 124 disposed on the side of the dielectric layer structure 121 opposite to the electronic component 110.

Because the chip 111 and the board structure 120 have different coefficients of thermal expansion (CTE), the CTE mismatch between the chip 111 and the board structure 120 causes the warpage of the board structure 120. When the board structure 120 is disposed on a printed circuit board, the warpage of board structure 120 generates stress on the bumps 126, such that the bumps 126 are often damaged and joints may fail.

For the mount region 122, because the chip 111 is disposed on the mount region 122, the warpage of the mount region 122 may not be serious because of the support of the chip 111. However, the warpage of the peripheral region 123 is often serious since there is no other supporter. By disposing the elastomer 129 in the peripheral region 123, the stress transferred from the mount region 122 to the peripheral region 123 is absorbed by the elastomer 129, such that the warpage of the peripheral region 123 is lessened or disappears. Therefore, the bumps 126 may not receive too much stress, and the joint issue can be avoided.

The elastomer 129 is adjacent to the mount region 122. Embodiments of this disclosure are not limited thereto. The person having ordinary skill in the art can make proper modifications to the elastomer 129 depending on the actual application.

The elastomer 129 is made of polyimide. Embodiments of this disclosure are not limited thereto. The person having ordinary skill in the art can make proper modifications to the elastomer 129 depending on the actual application.

In this embodiment, the dielectric layer structure 121 is a core layer. Embodiments of this disclosure are not limited thereto. In other embodiments, the dielectric layer structure 121 may be an interposer such as a glass interposer or a silicon interposer.

The board structure 120 is a copper clad laminate, and the patterned conductive layers 124, which are disposed on two sides of the dielectric layer structure 121, are made of copper.

The dielectric layer structure 121 has a first surface 121a and a second surface 121b opposite to the first surface 121a, and the first surface 121a and the second surface 121b exposes the elastomer 129. In other words, the elastomer 129 passes through the dielectric layer structure 129.

In this embodiment, the thickness of the elastomer 129 approximately equals to the minimum distance between the first surface 121a and the second surface 121b. Embodiments of this disclosure are not limited thereto. In other embodiment, the thickness of the elastomer 129 may be greater than the minimum distance between the first surface 121a and the second surface 121b.

An orthogonal projection of the electronic component 110 on the board structure 120 at least partially overlaps the elastomer 129. In this embodiment, the board structure 120 is disposed along a first direction D, the distance G1 between a center of the elastomer 129 and an outer edge of the orthogonal projection of the electronic component 110 on the board structure 120 along the first direction D is less than 5 mm. Embodiments of this disclosure are not limited thereto. The person having ordinary skill in the art can make proper modifications to the electronic component 110 and the board structure 120 depending on the actual application.

Outer edges of the mount region 122 are defined by deposition positions of the outermost bumps 112. In this embodiment, the outer edges of the mount region 122 are defined by an orthogonal projection of the outermost bumps 112 on the board structure 120.

The board structure 120 further includes two solderesist layers 127. The two solderesist layers 127 respectively covers the two patterned conductive layers 124 disposed on two sides of the dielectric layer structure 121.

Figure 2:
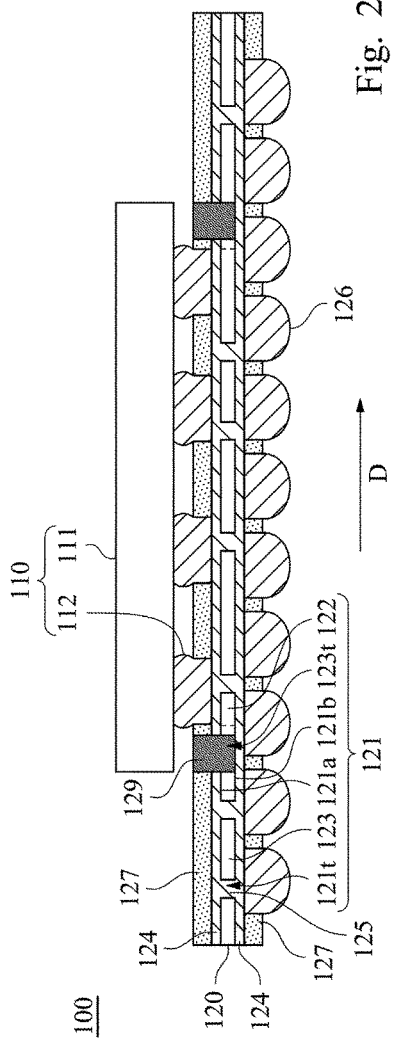
FIG. 2 is a schematic cross-sectional view of the semiconductor structure according to another embodiment of this disclosure.

FIG. 2 is a schematic cross-sectional view of the semiconductor structure 100 according to another embodiment of this disclosure. As shown in FIG. 2, the semiconductor structure 100 of this embodiment is similar to the semiconductor structure 100 of FIG. 1, and the difference between the two is that, in this embodiment, the elastomer 129 protrudes from at least one of the first surface 121a and the second surface 121b. In this embodiment, the elastomer 129 protrudes from the first surface 121a. Therefore, the thickness of the elastomer 129 is greater than the minimum distance between the first surface 121a and the second surface 121b.

In addition, because the elastomer 129 protrudes from the first surface 121a, and the elastomer 129 is embedded in the solderesist layer 127, the part of the elastomer 129 embedded in the solderesist layer 127 has the same function as that of the solderesist layer 127, that is, the part of the elastomer 129 embedded in the solderesist layer 127 protects the patterned conductive layers 124 as well.

Figure 3:
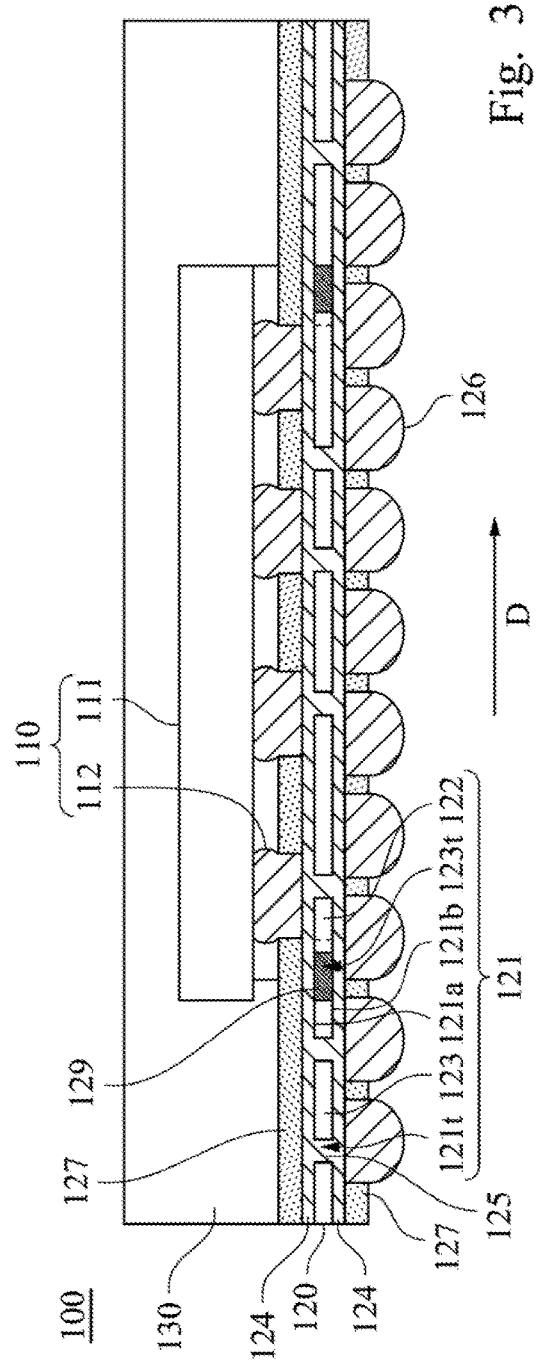
FIG. 3 is a schematic cross-sectional view of the semiconductor structure according to another embodiment of this disclosure.

FIG. 3 is a schematic cross-sectional view of the semiconductor structure 100 according to another embodiment of this disclosure. As shown in FIG. 3, the semiconductor structure 100 of this embodiment is similar to the semiconductor structure 100 of FIG. 1, and the difference between the two is that, in this embodiment, the semiconductor structure 100 further includes a package layer 130. The package layer 130 is disposed on one side of the board structure 120 facing the electronic component 110 and covers the electronic component 110. In this embodiment, the package layer 130 is disposed on the solderesist layer 127 and covers the chip 111.

The package layer 130 is made of epoxy molding compound. Embodiments of this disclosure are not limited thereto. The person having ordinary skill in the art can make proper modifications to the package layer 130 depending on the actual application.

Figure 4:
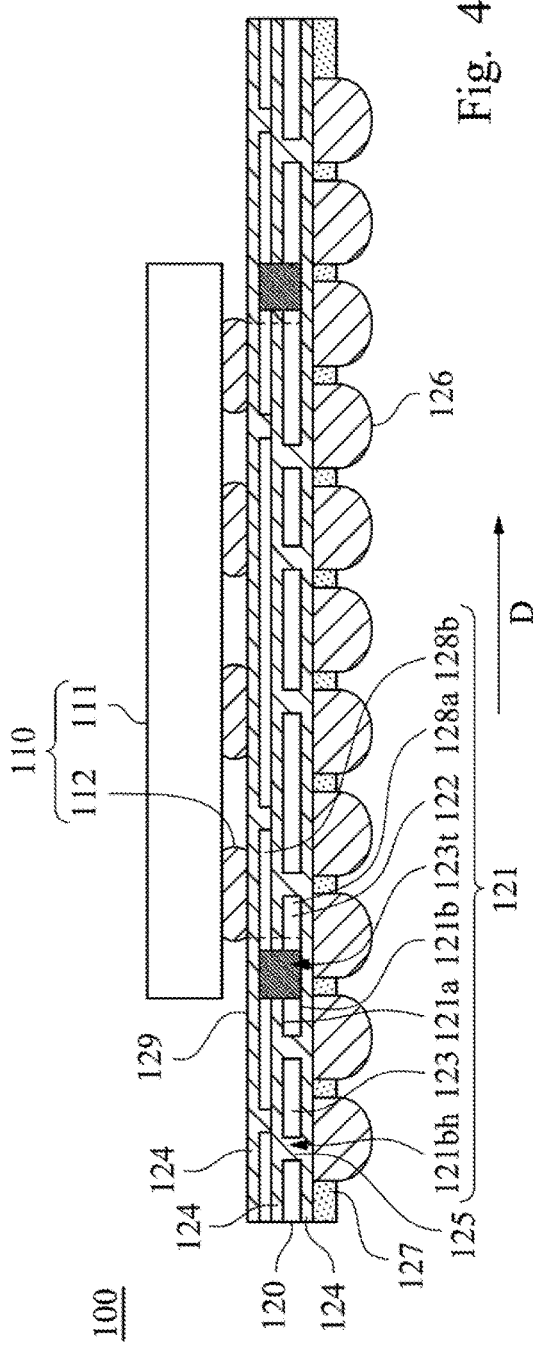
FIG. 4 is a schematic cross-sectional view of the semiconductor structure according to another embodiment of this disclosure.

FIG. 4 is a schematic cross-sectional view of the semiconductor structure 100 according to another embodiment of this disclosure. As shown in FIG. 4, the semiconductor structure 100 of this embodiment is similar to the semiconductor structure 100 of FIG. 1, and the main difference between the two is that, in this embodiment, the dielectric layer structure 121 includes a core layer 128a and at least one build-up dielectric layer 128b. In addition, the number of the patterned conductive layer 124 may be greater than two, and some of the patterned conductive layer 124 is disposed between the core layer 128a and the build-up dielectric layer 128b or between the build-up dielectric layers 128b (if the number of the build-up dielectric layer 128b is greater than two). The dielectric layer structure 121 further includes at least one blind hole 121bh and at least one buried hole (not shown in Figs.), and there may be no second through hole 121t in this embodiment. The conductive via 125 is disposed in the blind hole 121bh.

FIG. 5 is a schematic cross-sectional view of the semiconductor structure 100 according to another embodiment of this disclosure. As shown in FIG. 5, the semiconductor structure 100 of this embodiment is similar to the semiconductor structure 100 of FIG. 1, and the main difference between the two is that, in this embodiment, the electronic component 110 include a chip 111 and an die attachment 113 disposed between the chip 111 and the board structure 120. Outer edges of the mount region 122 are defined by outer edges of an orthogonal projection of the chip 111 on the board structure 120.

In addition, the semiconductor structure 100 may further includes at least one bonding wire 140. The bonding wire 140 is connected to the chip 111 and the patterned conductive layer 124 disposed on the side of the dielectric layer structure 121 facing the electronic component 110.

Moreover, in this embodiment, the elastomer 129 does not protrude from at least one of the first surface 121a and the second surface 121b. Embodiments of this disclosure are not limited thereto. In other embodiment, the elastomer 129 may protrude from at least one of the first surface 121a and the second surface 121b.

The die attachment 113 may be a paste or a film. Embodiments of this disclosure are not limited thereto. The person having ordinary skill in the art can make proper modifications to the die attachment 113 depending on the actual application.

FIG. 6 is a schematic cross-sectional view of the semiconductor structure 100 according to another embodiment of this disclosure. As shown in FIG. 6, the semiconductor structure 100 of this embodiment is similar to the semiconductor structure 100 of FIG. 5, and the main difference between the two is that, in this embodiment, the mount region 122 is smaller than the orthogonal projection of the chip 111 on the board structure 120, and the distance G2 between outer edges of the mount region 122 and outer edges of the orthogonal projection of the chip 111 on the board structure 120 along the first direction D is less than 5 mm.

Figure 7:
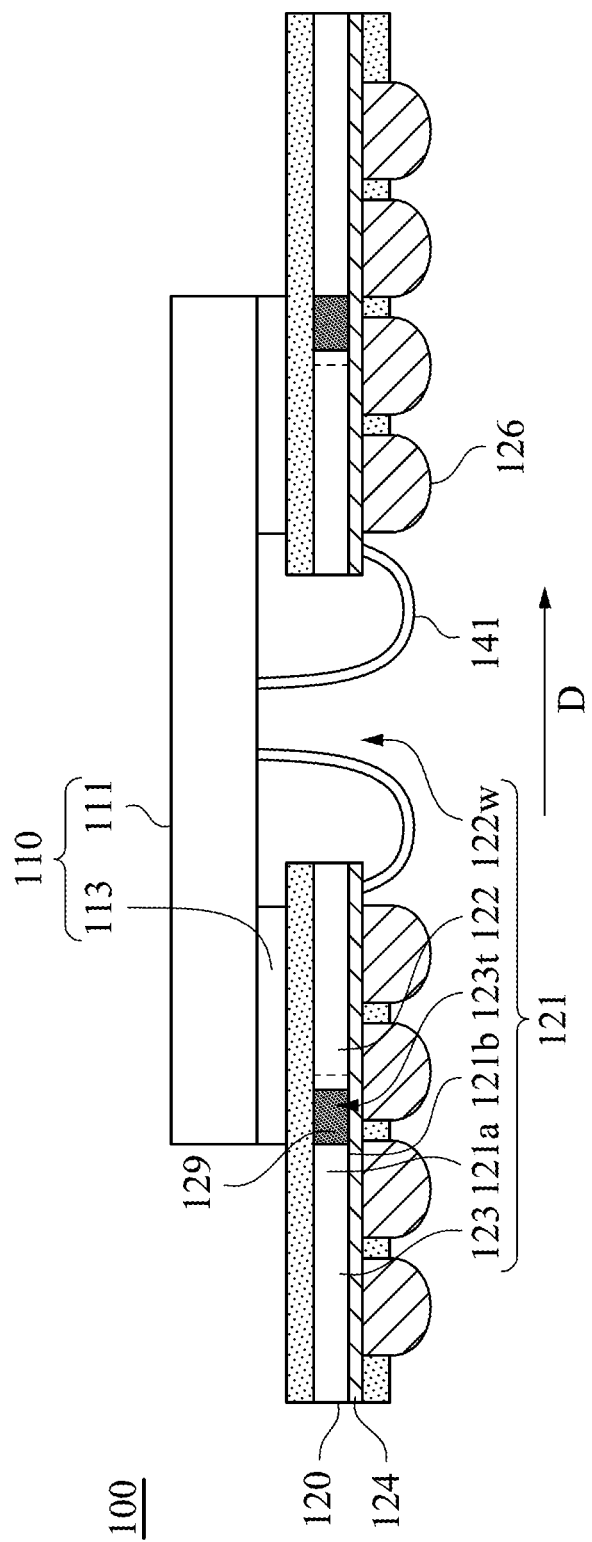
FIG. 7 is a schematic cross-sectional view of the semiconductor structure according to another embodiment of this disclosure.

FIG. 7 is a schematic cross-sectional view of the semiconductor structure 100 according to another embodiment of this disclosure. As shown in FIG. 7, the semiconductor structure 100 of this embodiment is similar to the semiconductor structure 100 of FIG. 5, and the difference between the two is that, in this embodiment, the mount region 122 further has a window 122w. The window 122w exposes the chip 111 to the side of the board structure 120 opposite to the electronic component 110. In addition, the semiconductor structure 100 does not includes the bonding wire 140. Instead, the semiconductor structure 100 further includes at least one bonding wire 141. The bonding wire 141 is connected to the chip 111 and the patterned conductive layer 124 disposed on the side of the dielectric layer structure 121 opposite to the electronic component 110.

FIGS. 8 to 12 are schematic cross-sectional views of intermediate steps in a method for manufacturing the semiconductor structure 100 according to one embodiment of this disclosure. As shown in FIG. 8, a dielectric layer structure 121, i.e., a core layer in this embodiment, is provided. Then, at least one first through hole 123t is formed in the dielectric layer 121.

The first through hole 123t is formed by laser or mechanical force. Embodiments of this disclosure are not limited thereto. The person having ordinary skill in the art can make proper modifications to the forming method of the first through hole 123t depending on the actual application.

As shown in FIG. 9, at least one elastomer 129 is formed in the first through hole 123t. In this embodiment, the elastomer 129 is made of polyimide, and the elastomer 129 is formed by filling solution polyimide into the first through hole 123t and then heating and curing the solution polyimide.

Then, as shown in FIG. 10, forming two conductive layers 124p are formed on two sides of the dielectric layer structure 121. In this embodiment, the conductive layers 124p are made of copper, and the conductive layers 124p are formed on two sides of the dielectric layer structure 121 by thermal compression.

As shown in FIG. 10 and FIG. 11, at least one second through hole 121t is formed in the dielectric layer structure 121. Then, at least one conductive via 125 is formed in the second through hole 121t. Then, the conductive layers 124p are patterned to become two patterned conductive layers 124. Then, two solderesist layers 127 are formed and respectively covers the two patterned conductive layers 124 disposed on two sides of the dielectric layer structure 121.

The through hole 123t is formed by laser or mechanical force. The conductive via 125 is formed by plating process. The conductive layers 124p are patterned by etching. The solderesist layers 127 respectively have a plurality of openings 127o to expose the patterned conductive layers 124.

As shown in FIG. 12, an electronic component 110 is disposed on the patterned conductive layer 124. In this embodiment, the electronic component 110 includes a chip 111 and a plurality of bumps 112. The bumps 112 are connected to the chip 111 and the exposed patterned conductive layer 124.

Then, a package layer 130 is formed on the solderesist layer 127 and the electronic component 110, such that the electronic component 110 is surrounded by the package layer 130.

Then, a plurality of bumps 126 are formed on the exposed patterned conductive layer 124 disposed on the side of the dielectric layer structure 121 opposite to the electronic component 110. Therefore, a semiconductor structure 100, which is a package structure, is formed.

FIG. 13 is a schematic cross-sectional view of the semiconductor structure 100 and a printed circuit board 200 according to one embodiment of this disclosure. As shown in FIG. 13, the semiconductor structure 100 is disposed on a printed circuit board 200. In this embodiment, the bumps 126 are connected to the patterned conductive layer 124 and the patterned conductive 224 of the printed circuit board 200.

In another aspect of the disclosure, a printed circuit board 200 is provided, and the printed circuit board 200 is a semiconductor structure. In this embodiment, the printed circuit board 200 includes an electronic component and a board structure 220. The electronic component is the semiconductor structure 100. The board structure 220 includes a dielectric layer structure 221 and at least one elastomer 229. The dielectric layer structure 221 has a mount region 222 and a peripheral region 223 surrounding the mount region 222. The semiconductor structure 100 is disposed on the mount region 222, and the peripheral region 223 has at least one first through hole 223t. The elastomer 229 is disposed in the first through hole 223t.

The semiconductor structure 100 includes a chip carrier 190 and a chip 111 disposed on the chip carrier 190.

The semiconductor structure 100 further includes a plurality of bumps 126 connected to the chip carrier 190 and the board structure 220. Outer edges of the mount region 222 are defined by deposition positions of the outermost bumps 126. In this embodiment, the outer edges of the mount region 222 are defined by outer edges of an orthogonal projection of the outermost bumps 126 on the board structure 220.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A semiconductor structure, comprising:
 an electronic component; and
 a board structure, comprising:
  a dielectric layer structure having a mount region and a peripheral region surrounding the mount region, wherein the electronic component is disposed on the mount region, and the peripheral region has at least one first through hole; and
  at least one elastomer disposed in the first through hole.

2. The semiconductor structure of claim 1, wherein the dielectric layer structure has a first surface and a second surface opposite to the first surface, and the first surface and the second surface exposes the elastomer.

3. The semiconductor structure of claim 2, wherein the elastomer protrudes from at least one of the first surface and the second surface.

4. The semiconductor structure of claim 1, wherein the dielectric layer structure has a first surface and a second surface opposite to the first surface, and the thickness of the elastomer is greater than or equals to the minimum distance between the first surface and the second surface.

5. The semiconductor structure of claim 1, wherein the elastomer is made of polyimide.

6. The semiconductor structure of claim 1, wherein the elastomer passes through the dielectric layer structure.

7. The semiconductor structure of claim 1, wherein the elastomer is adjacent to the mount region.

8. The semiconductor structure of claim 1, wherein an orthogonal projection of the electronic component on the board structure at least partially overlaps the elastomer.

9. The semiconductor structure of claim 7, wherein the board structure is disposed along a first direction, the distance between a center of the elastomer and an outer edge of the orthogonal projection of the electronic component on the board structure along the first direction is less than 5 mm.

10. The semiconductor structure of claim 1, wherein the board structure further comprises:
 a patterned conductive layer disposed on the dielectric layer structure.

11. The semiconductor structure of claim 10, wherein the dielectric layer structure further have at least one second through hole; and
 the board structure further comprises:
  at least one conductive via disposed in the second through hole and electronically connected to the patterned conductive layer.

12. The semiconductor structure of claim 1, wherein the dielectric layer structure is a core layer or an interposer.

13. The semiconductor structure of claim 1, wherein the dielectric layer structure comprises a core layer and at least one build-up dielectric layer.

14. The semiconductor structure of claim 1, wherein the board structure is a chip carrier and the electronic component comprises a chip.

15. The semiconductor structure of claim 14, wherein the electronic component further comprises a plurality of bumps connected to the chip and the board structure, wherein outer edges of the mount region are defined by deposition positions of the outermost bumps.

16. The semiconductor structure of claim 14, wherein the electronic component further comprises an die attachment disposed between the chip and the board structure, wherein outer edges of the mount region are defined by outer edges of an orthogonal projection of the chip on the board structure.

17. The semiconductor structure of claim 14, wherein the electronic component further comprises an die attachment disposed between the chip and the board structure, and the board structure is disposed along a first direction, wherein the mount region is smaller than an orthogonal projection of the chip on the board structure, and the distance between outer edges of the mount region and outer edges of the orthogonal projection of the chip on the board structure along the first direction is less than 5 mm.

18. The semiconductor structure of claim 1, wherein the board structure is a printed circuit board and the electronic component comprises a chip carrier and a chip disposed on the chip carrier.

19. The semiconductor structure of claim 18, wherein the electronic component further comprises a plurality of bumps connected to the chip carrier and the board structure, wherein outer edges of the mount region are defined by deposition positions of the outermost bumps.

20. The semiconductor structure of claim 1, wherein the board structure is a copper clad laminate.

* * * * *